(12) United States Patent
Ning et al.

(10) Patent No.: US 8,642,407 B2
(45) Date of Patent: Feb. 4, 2014

(54) DEVICES HAVING REDUCED SUSCEPTIBILITY TO SOFT-ERROR EFFECTS AND METHOD FOR FABRICATION

(75) Inventors: Tak H. Ning, Yorktown Heights, NY (US); Philip J. Oldiges, Lagrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 153 days.

(21) Appl. No.: 12/939,506

(22) Filed: Nov. 4, 2010

(65) Prior Publication Data

US 2012/0112246 A1 May 10, 2012

(51) Int. Cl.
*H01L 21/00* (2006.01)
(52) U.S. Cl.
USPC .................. 438/154; 257/E21.632; 257/214
(58) Field of Classification Search
USPC ............ 257/214, E21.632, E27.063; 438/154
See application file for complete search history.

(56) References Cited

U.S. PATENT DOCUMENTS

| | | | |
|---|---|---|---|
| 7,368,358 B2 * | 5/2008 | Ouyang et al. ............... | 438/299 |
| 2007/0032024 A1 * | 2/2007 | Peidous et al. ............... | 438/299 |
| 2007/0096149 A1 * | 5/2007 | Liu et al. ............... | 257/192 |
| 2008/0119031 A1 * | 5/2008 | Pal et al. ............... | 438/483 |
| 2010/0271057 A1 | 10/2010 | Cannon et al. | |
| 2011/0084319 A1 * | 4/2011 | Zhu et al. ............... | 257/288 |

FOREIGN PATENT DOCUMENTS

EP     0430280 A2     6/1991

OTHER PUBLICATIONS

Oldiges, P., et al. "Technologies to Further Reduce Soft Error Susceptibility in SOI" Electron Devices Meeting (IEDM), 2009 IEEE International. Dec. 2009. pp. 405-408.
Yamamoto, Y., et al. "Selective Polycrystalline SI and Sige Deposition on Epitaxial SI Induced by B-Atomic Layer Doping" ECS Transactions. Oct. 2008. pp. 503-510.

* cited by examiner

Primary Examiner — Wael Fahmy
Assistant Examiner — Sarah Salerno
(74) Attorney, Agent, or Firm — Tutunjian & Bitetto, P.C.; Louis Percello (57) ABSTRACT

A semiconductor-on-insulator (SOI) substrate complementary metal oxide semiconductor (CMOS) device and fabrication methods include a p-type field effect transistor (PFET) and an n-type field effect transistor (NFET). Each of the PFET and the NFET include a transistor body of a first type of material and source and drain regions. The source and drain regions have a second type of material such that an injection charge into the source and drain region is greater than a parasitic charge into the transistor body to decrease parasitic bipolar current gain, increase critical charge (Qcrit) and reduce sensitivity to soft errors.

10 Claims, 7 Drawing Sheets

DEVICES HAVING REDUCED SUSCEPTIBILITY TO SOFT-ERROR EFFECTS AND METHOD FOR FABRICATION

BACKGROUND

1. Technical Field

The present invention relates to semiconductor device and fabrication and more particularly to devices configured to reduce susceptibility to soft error effects.

2. Description of the Related Art

Soft-errors are errors in data or state that occur not due to hard failures of a device, but due to other circumstances. For example, soft-errors may occur due to charge leakage, radiation, decay, etc. and not assumed to imply a mistake or breakage of the device. After observing a soft error, there is no implication that a device is any less reliable than before.

If detected, a soft error may be corrected by rewriting correct data in place of erroneous data. Soft errors involve changes to data, e.g., in the electrons in a storage circuit, but not changes to a physical circuit. If the data is rewritten, the circuit will work perfectly again. Compared to bulk complementary metal oxide semiconductors (CMOS), silicon on insulator (SOI) CMOS is less prone to soft-error effects. However, the soft-error effects in SOI CMOS devices are still appreciable.

In the operation of a SOI field effect transistor (FET), there is a parasitic bipolar transistor formed with the source region acting as the emitter, the body region acting as the base, and the drain region acting as the collector. Whenever the emitter-base diode is forward biased, charge is injected from the emitter into the base region and collected by the collector, and charge is injected from the base region into the emitter. The charge collected at the collector gives rise to a collector current, and the charge injected from the base into the emitter gives rise to a base current. The current gain of the parasitic bipolar transistor is the ratio of the collector current to the base current.

SUMMARY

A semiconductor-on-insulator (SOI) complementary metal oxide semiconductor (CMOS) device and fabrication method includes a p-type field effect transistor (PFET) and an n-type field effect transistor (NFET). Each of the PFET and the NFET include a transistor body of a first conductivity type of material and source and drain regions. The source and drain regions have a second conductivity type of material. The source and drain regions have a smaller energy bandgap than the body region, such that if and when the body region is forward biased with respect to the source or drain region, the injection charge from the body region into the source or drain region is greater than the injection charge from the source region into the body region or from the drain region into the body region. Thus, the PFET and the NFET can have very small parasitic bipolar current gains, resulting in increased critical charge (Qcrit) for the PFET and NFET. Qcrit is a measure of the sensitivity of a device to soft errors. The larger the Qcrit, the smaller the sensitivity to soft errors.

A SOI CMOS device includes a p-type field effect transistor (PFET) and an n-type field effect transistor (NFET). Each of the PFET and the NFET include a transistor body of a first type of material and source and drain regions having a second type of material. An injection charge into the source and drain region is greater than a parasitic charge into the transistor body to decrease parasitic bipolar current gain, increase critical charge (Qcrit) and reduce sensitivity to soft errors.

A method for fabricating a complementary metal oxide semiconductor device includes removing portions of a semiconductor layer of a semiconductor-on-insulator (SOI) substrate adjacent to gate structures to form a transistor body of a first material adjacent to openings; and growing a monocrystalline material in the openings in contact with the transistor body to form source and drain regions for p-type field effect transistors (PFET) and n-type field effect transistors (NFET) wherein the source and drain regions include a second type of material selected such that an injection charge into the source and drain region is greater than a parasitic charge into the transistor body to decrease parasitic bipolar current gain, increase critical charge (Qcrit) and reduce sensitivity to soft errors during operation.

Another method for fabricating a complementary metal oxide semiconductor device includes forming gate structures on a semiconductor layer of a semiconductor-on-insulator substrate which forms a transistor body of a first material; and implanting an implant species into regions adjacent to the gate structures to form source and drain regions for p-type field effect transistors (PFET) and n-type field effect transistors (NFET) wherein the source and drain regions include the implant species which is not included in the transistor body, the dopant species being selected such that an injection charge into the source and drain region is greater than a parasitic charge into the transistor body to decrease parasitic bipolar current gain, increase critical charge (Qcrit) and reduce sensitivity to soft errors during operation.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

In accordance with the present principles, devices and methods for fabrication are provided that reduce soft error sensitivity of transistor devices. In particularly useful embodiments, semiconductor on insulator (SOI) complementary metal oxide semiconductor (CMOS) devices have soft error effects reduced. Soft-error effects in an SOI CMOS device are a function of parasitic bipolar current gain of the device. The smaller the bipolar current gain, the larger Qcrit is for the device. Hence, the less sensitivity of the device to soft-error effects. Qcrit is the amount of charge needed to flip a stored bit.

In accordance with one embodiment, source/drain regions of a semiconductor device include a different material from a body of the device. The materials are selected to provide a smaller energy bandgap than the energy bandgap of the body region, causing a significant decrease in parasitic bipolar gain for the resulting SOI CMOS devices. For SOI devices, we will not use the term "well", but the term "body" to refer to the base of the parasitic bipolar. In normal operation of an SOI CMOS device, a diode formed between a body region and a drain region is either zero biased or reverse biased, and a diode formed between the body region and a source region is either zero biased or forward biased. Thus, the source region functions as an emitter, the body region as a base, and the drain region as a collector of the parasitic bipolar transistor.

In the case of a p-type field effect transistor (PFET), a self-biasing results from avalanche-breakdown at the collector/base (i.e., p+ region to an n-type body) junction region where avalanche-generated electron-hole pairs are created. The electrons generated from this effect accumulate in the n-type body, reducing the body potential with respect to the source or emitter region, and thus cause the base-emitter junction to be forward biased and turn on the parasitic bipolar transistor. Parasitic bipolar gain is defined as the collector current divided by the base current. If the collector current is larger than the base current, the parasitic current gain is larger than unity. If the collector current is small compared to the base current, the parasitic current gain can be significantly smaller than unity.

In one embodiment, Germanium is introduced to form SiGe, which is employed instead of Silicon, in the source/drain regions of both a semiconductor on insulator (SOI) PFET and NFET to reduce parasitic current gain and hence susceptibility of the CMOS device to soft-error effects.

Aspects of the present invention are described below with reference to flowchart illustrations and/or block diagrams of methods according to embodiments of the invention. It will be understood that, in some alternative implementations, the functions noted in the block diagrams may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It is to be understood that the present invention will be described in terms of a given illustrative architecture having a SOI wafer; however, other architectures, structures, substrate materials and process features and steps may be varied within the scope of the present invention. For example, the present embodiments are equally applicable to other semiconductor materials (e.g., GaAs).

Circuits or devices as described herein may be part of a design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Figure 1:
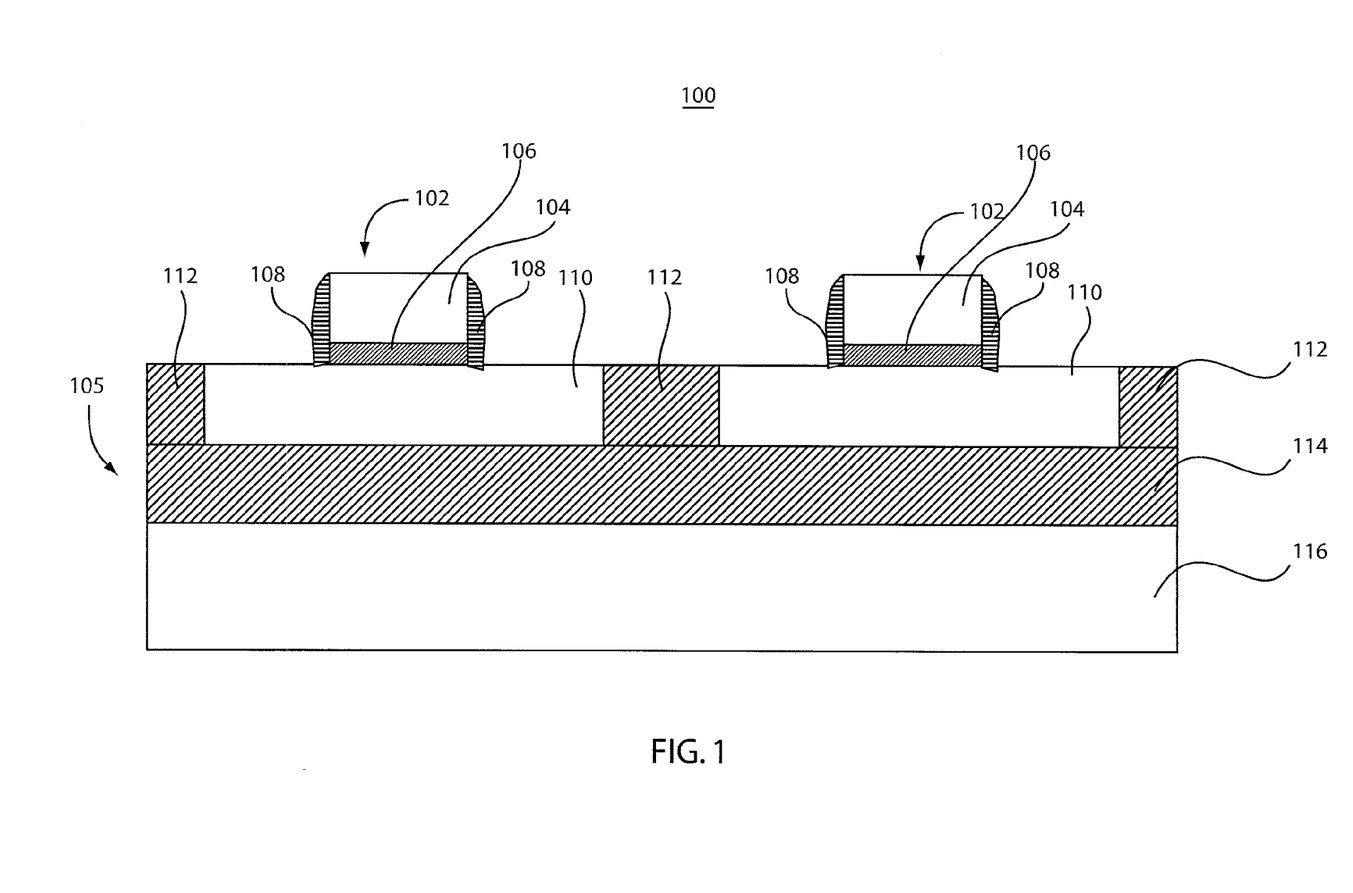
FIG. 1 is a cross-sectional view of a CMOS device having gate structures formed.

Referring now to the drawings in which like numerals represent the same or similar elements and initially to FIG. 1, a cross-sectional view of a complementary metal oxide semiconductor (CMOS) transistor device 100 is illustratively shown in accordance with an exemplary embodiment. The device 100 is formed on a substrate 105. The substrate 105 may include a silicon on insulator substrate or may include other materials and structures. For illustrative purposes, the substrate 105 is shown as a silicon on insulator structure, which includes a substrate layer 116, a buried dielectric layer 114 and a semiconductor layer 110. In one embodiment, the substrate layer 116 includes monocrystalline silicon, the buried dielectric layer 114 includes silicon dioxide and the semiconductor layer 110 includes monocrystalline silicon. It should be understood that other materials may be employed instead of or in addition to those described herein. The semiconductor layer 110 is patterned and shallow trench isolation (STI) regions 112 are formed.

Gate structures 102 are formed on portions of the semiconductor layer 110. the gate structures may include a gate dielectric 106, e.g., an oxide, nitride, high-K dielectric material, etc. A gate conductor 104 may include doped polysilicon, a metal or other conductive material. Spacers 108 are formed on side-walls of the gate structure 102 and may include a nitride or other dielectric materials.

Figure 2:
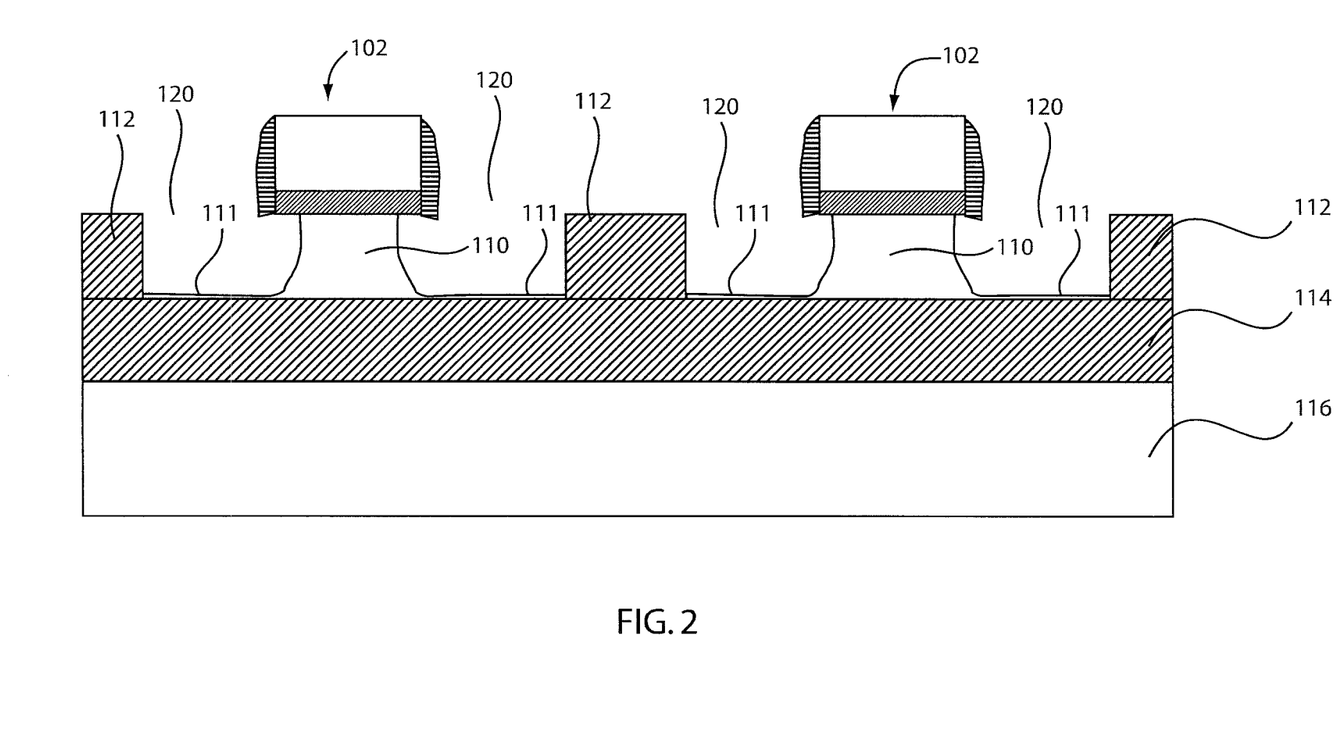
FIG. 2 is a cross-sectional view of the CMOS device of FIG. 1 having positions of a semiconductor layer removed adjacent to the gate structures in accordance with one embodiment.

Referring to FIG. 2, in accordance with the present principles, the formation of source and drain regions for both an n-type field effect transistor (NFET) and a p-type field effect transistor (PFET) will now be described in accordance with one illustrative method. It should be understood that other formation techniques may also be employed. Portions of semiconductor layer 110 are removed where source and drain regions are to be formed. The portions of the semiconductor layer 110 may be removed using a selective etch process, such as a reactive ion etch. Other etch methods may also be employed. The removal of the portions of the semiconductor layer 110 leave open regions 120 on opposite sides of the gate structures 102. To facilitate the growth of the source and drain regions by an epitaxial process, as described with reference to FIG. 3 below, it may be desirable to leave a thin layer 111 of the semiconductor 110 in the regions 120.

Figure 3:
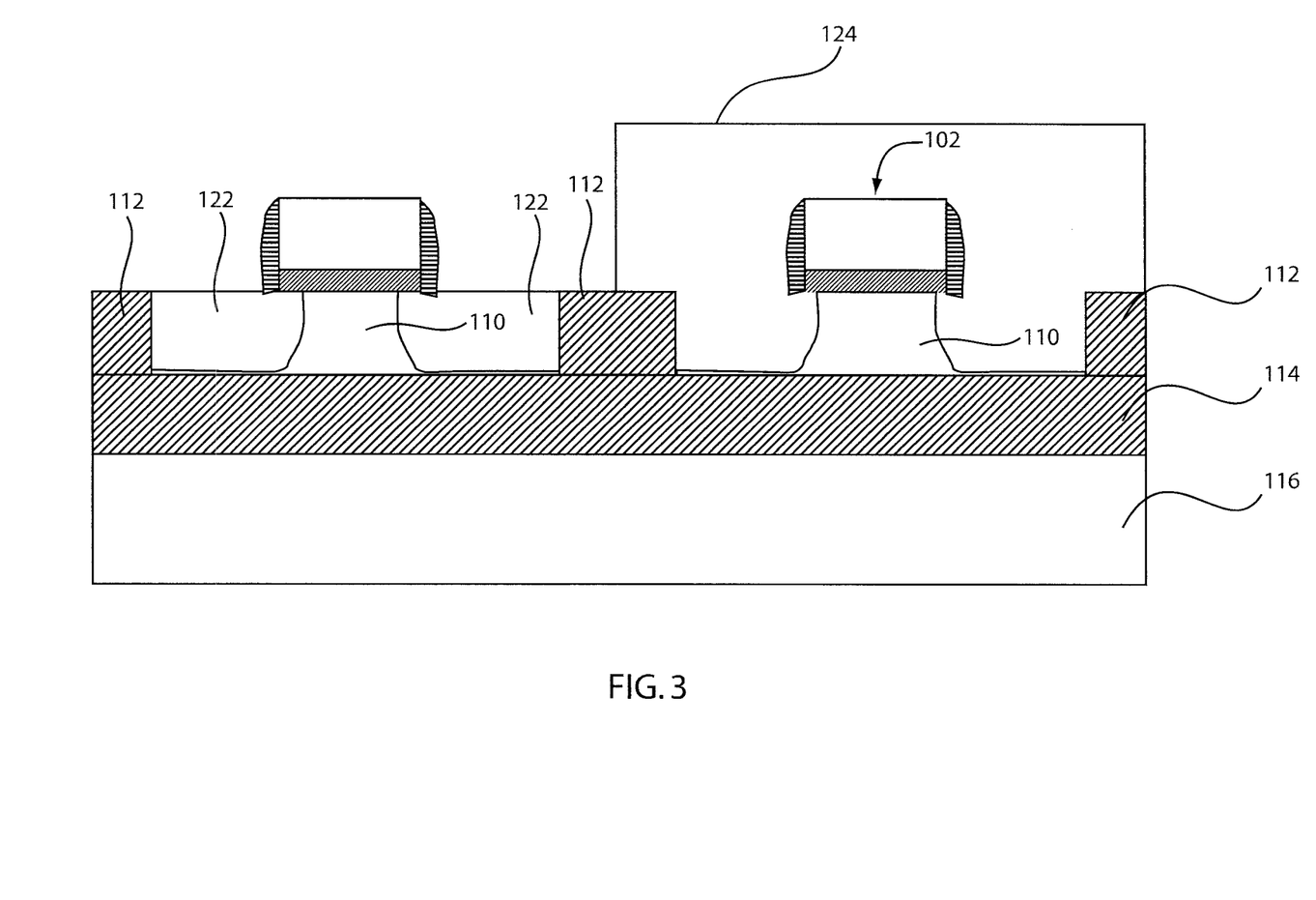
FIG. 3 is a cross-sectional view of the CMOS device of FIG. 2 having the positions filled with an epitaxially grown monocrystalline material to form source and drain regions in accordance with one embodiment.

Referring to FIG. 3, processing continues by forming the source and drain regions by epitaxial growth. In an epitaxial growth process, the growth starts typically from an exposed semiconductor surface. Thus, epitaxial growth starts from the exposed vertical surface and the exposed horizontal surface of semiconductor 110 in the regions 120. In one embodiment, SiGe is grown. SiGe is preferably grown in monocrystalline form. SiGe may be grown while simultaneously doping regions 122. If the regions 122 are simultaneously doped during the epitaxial growth process, the NFETs or the PFETs (whichever is not being foliated) need to be masked off using a patterned mask material 124. After the forming of one type of transistor, the first mask is removed and a second mask (not shown) is patterned on the other of the NFETs and PFETs. Then, the other source and drain regions would be formed with simultaneous doping.

Alternatively, the SiGe in regions 122 can be polycrystalline instead of monocrystalline. Methods for selectively depositing SiGe on Si are well known. For example, see Y. Yamamoto et al. in "Selective polycrystalline Si and SiGe deposition on epitaxial Si induced by B-atomic layer doping," ECS Transactions, vol. 16, issue 10, pp. 503-510, 2008, and T. Kamins in European patent application EP0430280A3. In the case of polycrystalline, the SiGe in the source and drains can be doped during SiGe deposition or doped by ion implantation after deposition.

Figure 4:
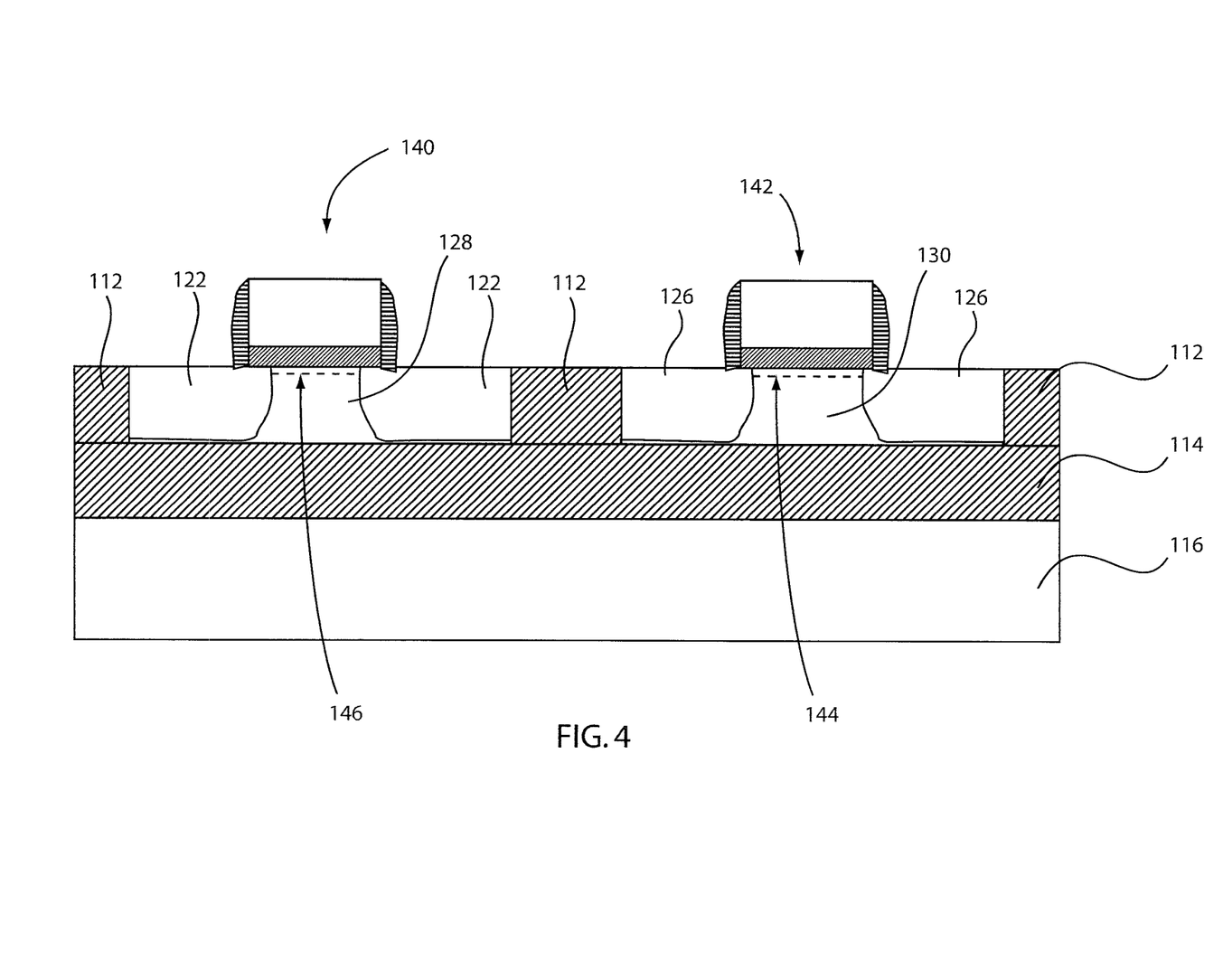
FIG. 4 is a cross-sectional view of the CMOS device of FIG. 3 having the positions alternately filled for an NFET and PFET with an epitaxially grown monocrystalline material to form source and drain regions, the source and drain regions being concurrently doped with the material in accordance with one embodiment.

Referring to FIG. 4, in accordance with the illustrative example, regions 122 are doped with an n+ type dopant and a body 128, which is silicon in this example, includes a p type dopant. N-type dopant may include, e.g., arsenic, and p-type dopant may include, e.g., boron. Other dopants may also be employed. An NFET device 140 is formed using this doping scheme in regions 122 and body 128. A PFET device 142 is formed by employing p+ type dopants in regions 126 (which include SiGe) and has an n-type dopant in a body 130. Body 128 and body 130 are floating (i.e., are electrically isolated).

Strained SiGe may be employed for PFET devices 142. In this case, the SiGe region is monocrystalline. In the source/drain regions 126, the strained SiGe induces strain in the PFET channel region 144, causing an increase in hole mobility in the PFET channel 144, which is beneficial for performance. However, for NFETs, the preference is to have the SiGe in the source/drain regions 122 unstrained, instead of being strained, because the strain induced in the NFET channel region 146 can actually lead to a decrease of electron mobility in the NFET channel 146. To avoid this, the SiGe in the source/drain regions 122 of the NFET should be relaxed, i.e. without strain. Relaxed SiGe in the source/drain regions 122 will not induce strain in the NFET channel regions 146.

Figure 5:
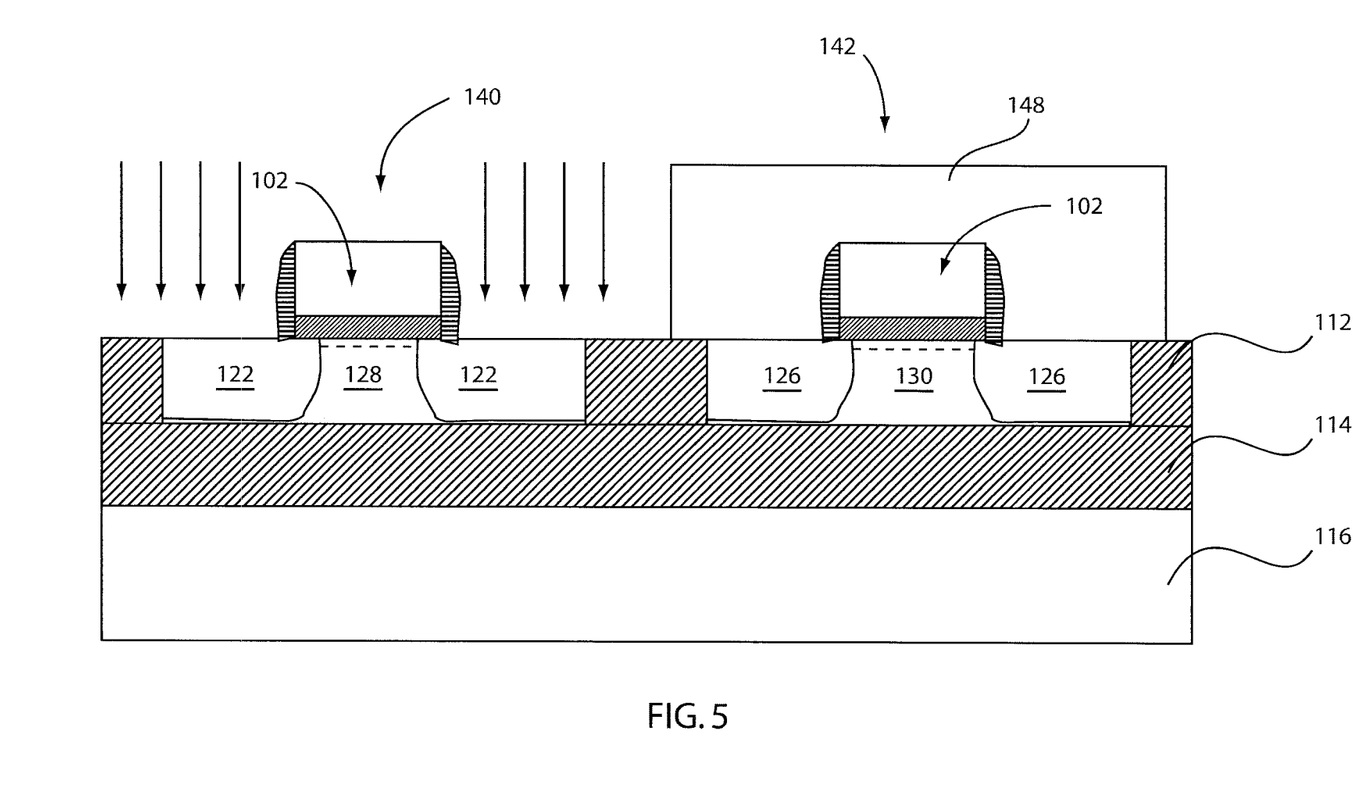
FIG. 5 is a cross-sectional view of the CMOS device of FIG. 4 showing implantation of ions for doping or altering the properties of the source and drain regions of the NFET and PFET in accordance with one embodiment.

Referring to FIG. 5, one way to have the SiGe in the NFET source/drain regions 122 unstrained is to perform an ion implantation into the SiGe regions. To accomplish this, a mask 148 is patterned over PFETs 142 and other devices or portions of the chip not to be implanted. An ion implantation process is performed into strained SiGe regions 122 to introduce defects, which cause the strained SiGe region to relax and become unstrained. The gate stack 102 of the NFET serves as a mask for the channel region 146, preventing the channel region 146 from being implanted.

In one embodiment, the ion implantation includes neutral species (e.g., Ar) introduced into regions 122 to promote relaxation. In another embodiment, ion implantation employs dopants employed to dope the regions 122. This may be performed instead of or in addition to the in-situ doping as described with reference to FIG. 3. After the ion implantation, the mask 148 is removed and processing can continue as is known in the art.

While the illustrative example has described the formation of source/drain regions using epitaxial growth (or other growth methods), the source and drain regions may also be modified to form, e.g., SiGe, by performing an ion implantation. In one embodiment, the silicon in layer 110 (FIG. 1) is bombarded with Ge ions to create SiGe. This may be employed for both NFETs 140 and PFETs 142. In another embodiment, the PFET 142 is formed by growing SiGe (strained) and the NFET 140 is formed by implanting Ge in the Si of layer 110 (unstrained). The processing for the two different types of device may include fanning masks 148 as depicted FIG. 5. An anneal process may be employed after Ge implantation to repair any potential damage.

In yet another embodiment, regions 122 and 126 may be formed using epitaxial growth and later bombarded with Ge to increase the molar ratio of Ge to Si. In this way, parasitic bipolar effects are further decreased and Qcrit is further raised. In one embodiment, the molar ratio of Ge to Si is 20% or more, and more particularly 40% or more.

Through the use of SiGe, instead of Si, for the source and drain regions (122, 126) of both the NFET 140 and the PFET 142, injection current from the body regions 128, 130 into the source/drain regions 122, 126 due to bipolar device action is significantly increased. This causes a proportionate decrease in parasitic bipolar current gain. The decrease in bipolar current gain results in an increase in Qcrit, and hence reduced sensitivity to soft-errors.

Figure 6:
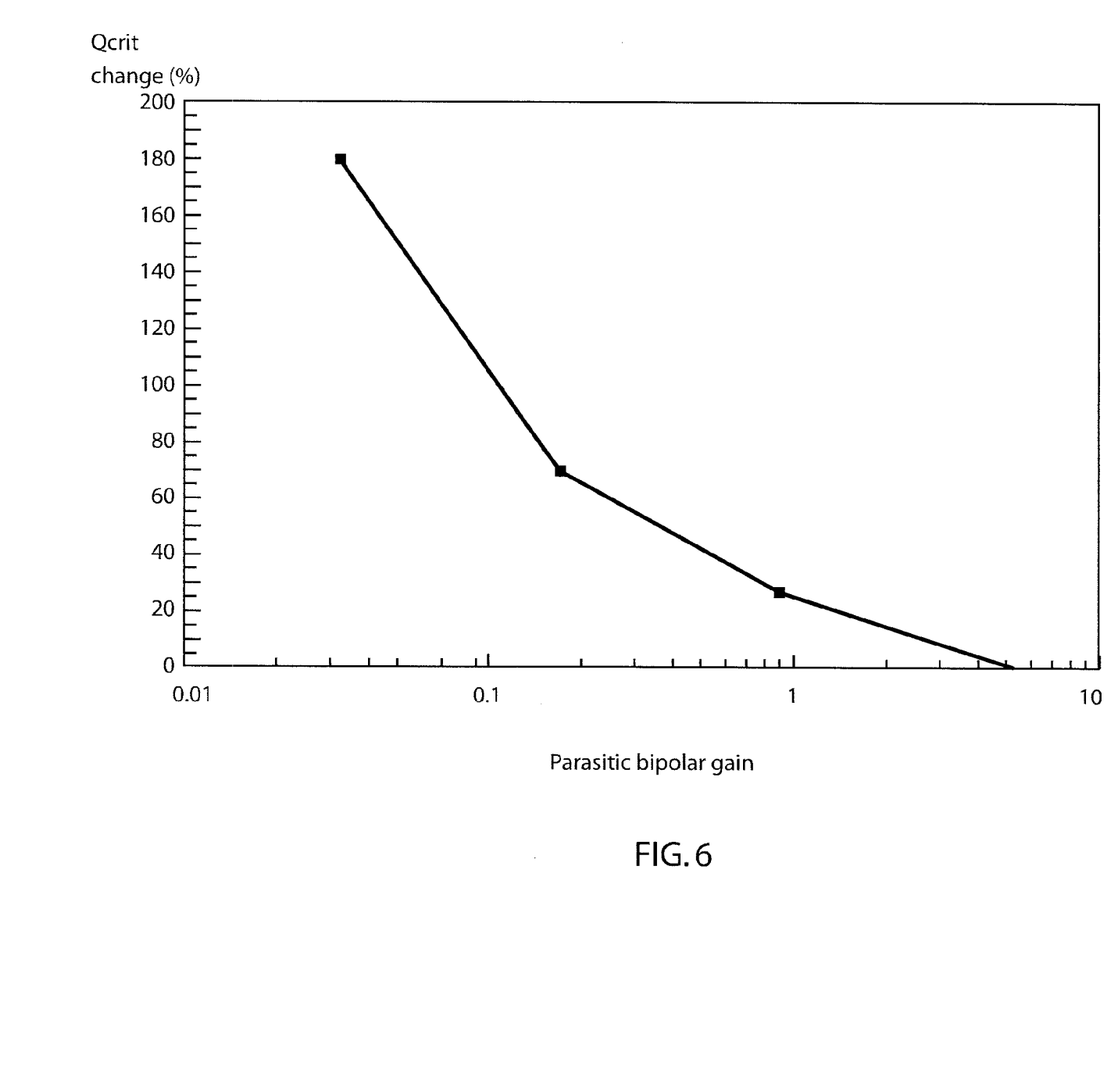
FIG. 6 is a plot of Qcrit versus parasitic bipolar gain in accordance with one embodiment.

As depicted in FIG. 6, a plot of Qcrit versus parasitic bipolar gain is shown. An increase in Qcrit is due to the presence of Ge in source and drain regions (122, 126). Current injected into SiGe regions is proportional to $\exp(\Delta Eg/kT)$, where $\Delta Eg$ is the bandgap narrowing due to the presence of Ge. With the SiGe source/drain regions (122, 126), a Si—SiGe interface is created between the body (128, 130) of the device and the source/drain regions (122, 126). With the addition of Ge in a p+ region, the barrier for electron injection from an n region into the p+ region is reduced (PFET). In addition, with the addition of Ge in an n+ region, the barrier for hole injection from a p region into the n+ region is reduced (NFET).

In one example, for a SiGe region having 20% Ge, $\Delta Eg$ is about 200 meV if the SiGe region is coherently strained. In this case, injected current is increased by a factor of about 2300, due to the presence of Ge. Parasitic bipolar current gain is decreased by the same factor, and Qcrit is more than 3× as large as without Ge. In another example, $\Delta Eg$ is about 100 meV if the SiGe region is not strained. Injected current is increased by a factor of about 50, due to the presence of Ge. Parasitic bipolar current gain is decreased by the same factor, and Qcrit is about 2× that without Ge.

Figure 7:
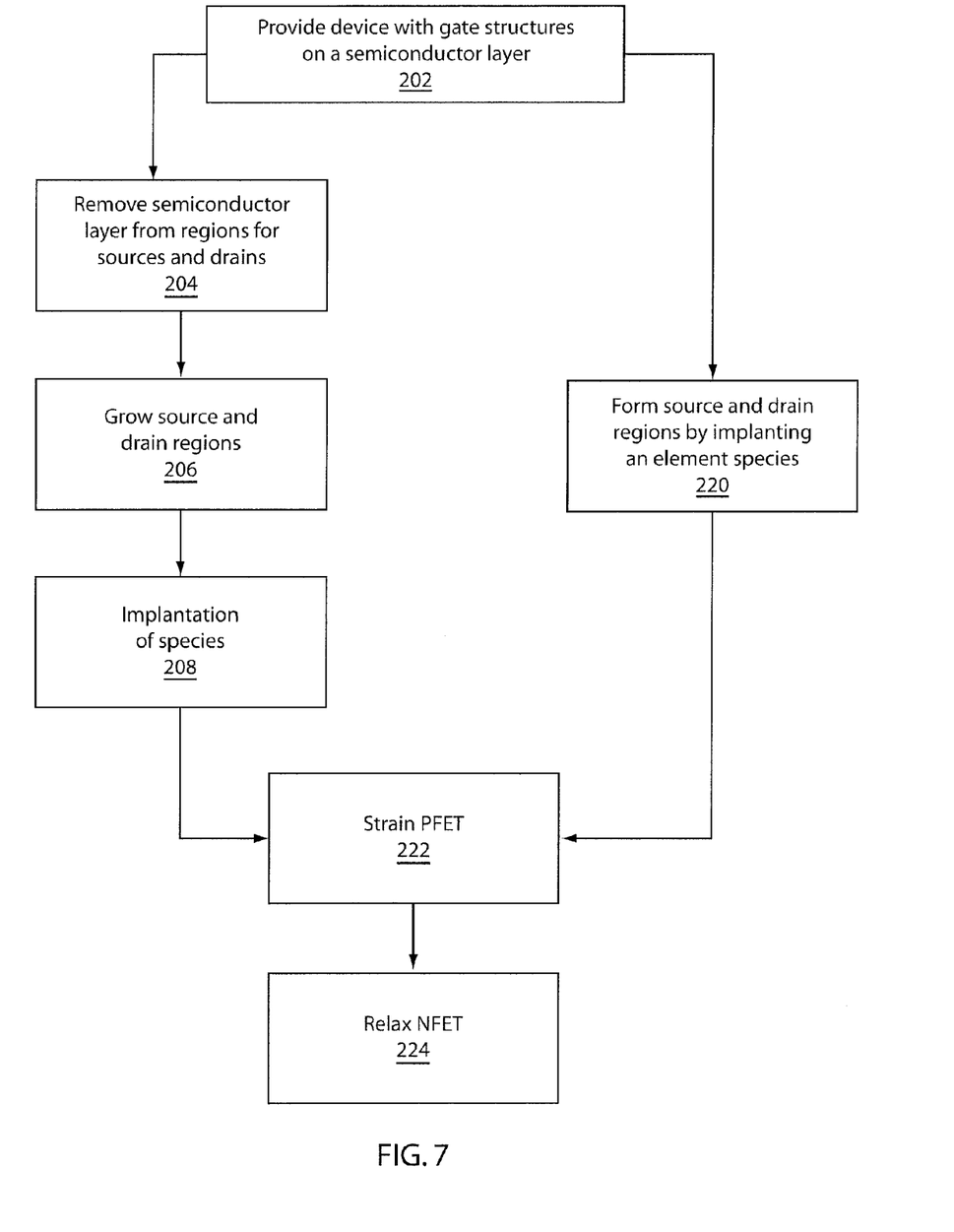
FIG. 7 is a block diagram showing methods for fabricating a CMOS device in accordance with the present principles.

Referring to FIG. 7, methods for fabricating a complementary metal oxide semiconductor device are illustratively shown. In block 202, semiconductor processing provides a device ready for the formation of source and drain regions. This includes the formation of a gate structure on a substrate, proper doping of the substrate, STI formation, etc. In one embodiment, portions of a semiconductor layer adjacent to gate structures are removed to form a transistor body of a first material adjacent to openings in block 204. This may include an etching process such as, e.g., a reactive ion etch (RIE). Proper masking may be provided. In block 206, a monocrystalline or polycrystalline material is grown in the openings in contact with the transistor body to form source and drain regions for p-type field effect transistors (PFET) and n-type field effect transistors (NFET). Growing the monocrystalline or polycrystalline material preferably includes an epitaxial process. The first type of material may include monocrystalline silicon, and the second type of material may include SiGe. In block 208, an additional implant or implants may be performed to increase a concentration of an element in the source and drain regions. For example, Ge may be further implanted to increase its concentration, e.g., a molar ratio of the SiGe is preferably greater than 20% for Ge to Si and more preferably greater than 40% for Ge to Si. Other dopants may also be implanted.

In an alternate embodiment, instead of removing material and epitaxially growing the monocrystalline material, the original substrate material is implanted, in block 220, with an implant species adjacent to the gate structures to foam source and drain regions for p-type field effect transistors (PFET) and n-type field effect transistors (NFET). The transistor body may include monocrystalline silicon and the implant species may include Ge to form SiGe. The implant may include other materials that alter the semiconductor properties between the transistor body and the source and drain regions. The implant may provide a molar ratio of the SiGe that is preferably greater than 20% for Ge to Si and more preferably greater than 40% for Ge to Si.

In blocks 206 and 220, the source and drain regions include a selected material such that an injection charge into the source and drain region is greater than a parasitic charge into the transistor body to decrease parasitic bipolar current gain, increase critical charge (Qcrit) and reduce sensitivity to soft errors during operation.

The source and drain regions of the PFET device are preferably strained in block 222. The strain may be induced using a strain layer or other mechanism or the strain provide during formation of the layer. In block 224, strain in the source and drain regions for the NFET device may be relaxed. This may include an implantation of a neutral or dopant species.

Having described preferred embodiments for devices having reduced susceptibility to soft-error effects and method for fabrication (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for fabricating a complementary metal oxide semiconductor device, comprising:
    removing portions of a semiconductor layer of a semiconductor-on-insulator (SOI) substrate adjacent to gate structures to form a transistor body of a first material adjacent to openings; and
    growing a monocrystalline material in the openings in contact with the transistor body forming source and drain regions for p-type field effect transistors (PFET) and n-type field effect transistors (NFET) wherein forming the source and drain regions includes providing a second type of material selected such that an injection charge into the source and drain region is greater than a parasitic charge into the transistor body to decrease parasitic bipolar current gain, increase critical charge (Qcrit) and reduce sensitivity to soft errors during operation.

2. The method as recited in claim 1, wherein the second type of material of the source and drain regions of the PFET device is strained.

3. The method as recited in claim 1, further comprising relaxing strain in the second type of material of the source and drain regions for the NFET device.

4. The method as recited in claim 3, wherein relaxing strain in the second type of material includes performing an ion implantation.

5. The method as recited in claim 1, wherein the first type of material includes monocrystalline silicon and the second type of material includes SiGe.

6. The method as recited in claim 5, wherein a molar ratio of the SiGe is greater than 20% for Ge to Si.

7. The method as recited in claim 5, wherein a molar ratio of the SiGe is greater than 40% for Ge to Si.

8. The method as recited in claim 1, wherein growing a monocrystalline material includes doping the monocrystalline material concurrently with formation of the monocrystalline material.

9. The method as recited in claim 1, further comprising doping the monocrystalline material after formation of the monocrystalline material.

10. The method as recited in claim 1, further comprising doping the monocrystalline material with Germanium to increase an amount of Germanium in the source and drain regions.

* * * * *